United States Patent
Tong et al.

(10) Patent No.: US 10,135,016 B2
(45) Date of Patent: *Nov. 20, 2018

(54) MULTILAYER FLEXIBLE PLANAR EMBEDDED LAMINATED ELECTRODE AND MANUFACTURING METHOD AND APPLICATION THEREOF

(71) Applicant: NORTHEAST NORMAL UNIVERSITY, Changchun, Jilin (CN)

(72) Inventors: Yanhong Tong, Jilin (CN); Yichun Liu, Jilin (CN); Qingxin Tang, Jilin (CN); Xiaoli Zhao, Jilin (CN)

(73) Assignee: Northeast Normal University, Changchun, Jilin (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/910,635

(22) PCT Filed: Jun. 26, 2015

(86) PCT No.: PCT/CN2015/000460
§ 371 (c)(1),
(2) Date: Feb. 5, 2016

(87) PCT Pub. No.: WO2016/008276
PCT Pub. Date: Jan. 21, 2016

(65) Prior Publication Data
US 2017/0125710 A1    May 4, 2017

(30) Foreign Application Priority Data

Jul. 17, 2014    (CN) .......................... 2014 1 0341768

(51) Int. Cl.
*H01L 51/10* (2006.01)
*H01L 51/00* (2006.01)
*H01L 51/05* (2006.01)

(52) U.S. Cl.
CPC ........ *H01L 51/105* (2013.01); *H01L 51/0023* (2013.01); *H01L 51/055* (2013.01); *H01L 51/102* (2013.01)

(58) Field of Classification Search
CPC .............. H01L 51/105; H01L 51/0508; H01L 51/0512; H01L 51/0545
See application file for complete search history.

(56) References Cited

U.S. PATENT DOCUMENTS

| 6,080,606 A | 6/2000 | Gleskova et al. |
| 8,277,901 B2* | 10/2012 | Nomoto ................ B82Y 10/00 427/256 |
| 8,475,671 B2* | 7/2013 | Jalabert ............... B81C 1/00206 216/41 |

FOREIGN PATENT DOCUMENTS

| CN | 1459877 A | 12/2003 |
| CN | 101645487 | 2/2010 |

(Continued)

OTHER PUBLICATIONS

CN 103280527—English Translation.*

*Primary Examiner* — Jose R Diaz
(74) *Attorney, Agent, or Firm* — Knobbe, Martens, Olson & Bear, LLP

(57) ABSTRACT

A flexible planar embedded laminated electrode can be manufactured by a method in which an octadecyl trichloro silane connected on the surface of a substrate; a source electrode, a drain electrode and a gate electrode are manufactured using photoetching; mercaptopropyl trimethoxysilane is connected at surfaces of metal electrodes of the source electrode, the drain electrode and the gate electrode; a polydimethylsiloxane is spin-coated on the respective surfaces for metal electrodes of the above electrodes; the gate electrode spin-coated with polydimethylsiloxane is removed from the substrate; oxygen plasma treatments are (Continued)

performed, so as to form hydroxy on the surfaces; the source electrode and the drain electrode are cut, and the gate electrode, the source electrode and the drain electrode are connected to form an integral to obtain the flexible planar embedded laminated electrode.

6 Claims, 7 Drawing Sheets

(56) References Cited

FOREIGN PATENT DOCUMENTS

| | | | |
|---|---|---|---|
| CN | 101931052 | A | 12/2010 |
| CN | 103000809 | A | 3/2013 |
| CN | 103280527 | A | 9/2013 |
| CN | 103890988 | A | 6/2014 |
| CN | 104112819 | A | 10/2014 |
| CN | 104134749 | A | 11/2014 |
| JP | 2008-258558 | A | 10/2008 |

* cited by examiner

MULTILAYER FLEXIBLE PLANAR EMBEDDED LAMINATED ELECTRODE AND MANUFACTURING METHOD AND APPLICATION THEREOF

CROSS-REFERENCE TO RELATED APPLICATIONS

This application is the U.S. National Phase under 35. U.S.C. § 371 of International Application PCT/CN2015/000460, filed Jun. 26, 2015, which claims priority to Chinese Patent Application No. 201410341768.5, filed Jul. 17, 2014. The disclosures of the above-described applications are hereby incorporated by reference in their entirety.

TECHNICAL FIELD

The present invention relates to a multilayer flexible planar embedded laminated electrode and manufacturing method and application thereof, which belongs to the field of organic electronic.

BACKGROUND

Since the first organic field effect transistor is invented in 1986 (Applied Physics Letters 1986, 49, 1210), because of its feature such as simple manufacturing process, wide range of material sources, low cost and good compatibility with flexible substrates, etc. (Nature 2004, 428, 911; Advanced Materials 2005, 17, 1705; Journal of Materials Chemistry 2005, 15, 53; Advanced Materials 2005, 17, 2411), such that the organic field effect transistors manufactured based on organic semiconductor materials are got much attention form researchers and has been rapidly developed. Depending on the different morphology of the organic semiconductor layer, the organic field effect transistor can be divided into organic thin-film field effect transistor and the organic single crystal field effect transistor. Compared with the organic film, there have not grain boundaries in the organic single crystal, and the ordering of the molecules in the organic single crystal enable it have good π-π orbital overlap, and the charge trap density is reduced to a minimum. Therefore, on the one hand, the organic single crystal field effect transistor is treated as an important tool for studying intrinsic transmission of organic semiconductors; on the other hand, it can be used in an effective method of extremely improving mobility of devices (Advanced Materials 1998, 10, 365). However, how to manufacture organic single crystal field effect transistor is currently a hot research. If using conventional methods (the vacuum deposition mask method) to directly construct electrodes on the organic semiconductor and manufacture a field effect transistor, an organic semiconductor will suffer thermal radiation injury, etc, seriously cause loss of the organic semiconductor field effect performance (Advanced Materials 2008, 20, 2947; Advanced Materials 2008, 20, 1511). In order to overcome the disadvantages brought by the vacuum deposition method, a new method for manufacturing an organic single crystal field effect transistor is required. In this regard, there are several research groups have already done some work. For example, Hu Wenping group invented two methods of the "gold film stamp" (Advanced Materials 2008, 20, 1511; Applied Physics Letters 2008, 92, 083309; Advanced Materials 2008, 20, 2947; Applied Physics Letters 2009, 94, 203304) and "Nanobelt electrodes" (Advanced Materials 2009, 21, 4234; Applied Physics Letters 2014, 104, 073112) to manufacture organic field-effect transistor, and the advantages of these two methods is that it can operate at room temperature, which effectively avoid the heat radiation damage to the organic semiconductor. But the disadvantage of this approach is that probe station operation is required to be used, which requires fine operation and is suitable for manufacturing a single device, and the degree of device integration is lower; device with bottom-gate top-contact configuration is suited for organic micro/nano-crystals, but not suitable for larger (>100 microns) crystals, which limit size for use of the crystal. To solve the problem of low integration, etc, Sundar research group invented the method of elastic transistor stamp, the stamp can be reusable, no damage to the crystal of bottom-gate bottom-contact rubrene field effect transistor and anisotropy of the rubrene crystals (Science, 2004 303, 1644) are studied. Bao Zhenan research group manufactures bottom-gate and bottom-contact organic single crystal field effect transistor using the method of photolithography on the elastic insulating layer or a vacuum evaporation electrode (Applied Physics Letters 2006, 89, 202108; Advanced Materials 2006, 18, 2320). Both methods employ device configuration of bottom gate bottom contact, and the manufactured source/drain/gate electrodes and the insulating layer are separated from the semiconductor, which means that firstly source/drain/gate electrodes and the insulating layer are manufactured, and then the semiconductor is directly placed above of the electrode and the insulating layer by use of electrostatic adsorption. On the one hand, the above two methods effectively avoid the heat radiation damage to the organic semiconductor, on the other hand, it also improves the integration of the device, thus, the manufacturations of multiple devices can be implemented at one time. Elastic transistor stamp method invented by the Sundar group has advantages of implementing electrode reuse and simplicity, etc. However, both methods have a common disadvantage that in the electrode structure manufactured by them as shown in FIG. 1, the source/drain electrodes are protruding from the surface of the insulating layer, thus such structure is more suitable for larger size of crystal and a wider channel length, and also limits the use size of the crystal and device to be small. Because when the organic micro/nano semiconductor is transferred onto such electrode structure, as shown in FIG. 2, this structure, of which electrode is projected, will lead organic semiconductor can not be completely fit with the insulating layer, and the air gap can be very easily formed near the electrodes. Therefore, this will lead to non-uniform of conduction channel of device and affect the performance of the device.

SUMMARY

The purpose of the present invention is to provide a multilayer flexible planar embedded laminated electrode and manufacturing method and the application thereof in the organic single-crystal field effect transistor, and the method provided by the present invention can be operated at room temperature, and thus in turn avoiding the pollution and damage from the solution and radiation to organic semiconductors; an electrode structure provided the present invention is a planar embedded electrode, namely the electrode and the insulating layer are in the same plane, which ensure that the organic semiconductor and the electrode and the insulating layer are completely fit to obtain high performance devices; and having high integration, complex patterns can be manufactured; can be reusable, and suitable to organic single crystals with various sizes.

The manufacturing method of the multilayer flexible planar embedded laminated electrode comprises the steps of:

(1) a octadecyl trichloro silane is connected on the surface of a substrate;

(2) a source electrode, a drain electrode and a gate electrode are manufactured on the substrate modified by step (1) using the method for photoetching respectively; connecting mercaptopropyl trimethoxysilane at surfaces of metal electrodes of the source electrode, the drain electrode and the gate electrode using a vapor phase method;

(3) a polydimethylsiloxane is spin-coated respectively on the surfaces of the source electrode, the drain electrode and the gate electrode obtained in step (2) and cured;

(4) the gate electrode spin-coated with polydimethylsiloxane is transferred from the substrate; oxygen plasma treatments are performed on the surface of metal electrode of the gate electrode and polydimethylsiloxane surfaces of the source electrode and the drain electrode respectively, i.e., hydroxy being formed on the surfaces;

(5) the source electrode and the drain electrode are clipped, and the surface of metal electrode of the gate electrode, the polydimethylsiloxane surfaces of the source electrode and the drain electrode are aligned, and heated into oven, thereby the gate electrode, the source electrode and the drain electrode are connected to form an integral, i.e., the multilayer flexible planar embedded laminated electrode being obtained.

In the production method described above, in step (1), the step for connecting a octadecyl trichloro silane is as follow:

the cleaned substrate is dipped into the mixed solution with concentrated sulfuric acid and hydrogen peroxide in volume ratio of 7:3; and then the substrate is cleaned, and the substrate is placed into the mixed solution with n-heptane and octadecyl trichloro silane in volume ratio of 1000:1, i.e., the surface of said substrate being connected to the octadecyl trichloro silane;

the substrate can be a silicon or glass.

In the manufacturing method described above, when the surfaces are aligned, the surface of the metal electrode of the gate electrode is attached on the polydimethylsiloxane surfaces of the source electrode and the drain electrode.

In the manufacturing method described above, in step (2), the conditions of the photoething method are as follow:

a photoresist is spin-coated on the substrate, placed at Ultraviolet lamp in 365 nm for exposure, then evaporating metal being performed, in turn after being developed and fixed;

the specifical steps can be preformed in accordance with the following steps:

spin-coating a layer of AZ5214 photoresist on the substrate; then placing the substrate with the spin-coated photoresist on a bake table at 100° C. for heating 3 minutes; then exposing the substrate that is heated and spin-coated with photoresist at 365 nm ultraviolet lamp for 20 s; and placing the exposed substrate into developer for developing 60 s; fixing deionized water for 30 s; evaporating metal for 25 nm on the photoetched-pattern substrate using the method of vacuum thermal evaporation; Finally, removing the photoresist by using the stripping liquid to form a patterned metal;

The mercaptopropyl trimethoxysilane is connected on surface of metal electrodes using vacuum vapor phase method, of which aim is to have a good connection between polydimethylsiloxane (PDMS) and metal, so as to beneficially transfer the metal electrode from the surface of substrate. The specific method is that the source, drain, and gate electrodes 30 μL mercapto propyl trimethoxy silane are placed into the vacuum system at the same time, to keep 7000 Pa pressure for 20 min, and finally forming a layer of mercapto propyl trimethoxy silane on the surface of electrode;

In the manufacturing method described above, in step (3), the thickness of the polydimethylsiloxane spin-coated on the gate electrode can be 50-500 μm;

Each of the thicknesses of the polydimethylsiloxane spin-coated on the source electrode and the drain electrode can be 0.8-5 μm;

The curing temperature can be 70-100° C., the curing time can be 12-2 h.

In the manufacturing method described above, in step (4), the treatment time for oxygen plasma can be 10-60 s.

In the manufacturing method described above, in step (5), the heating temperature can be 70-100° C., the heating time can be 10-30 minutes.

The present invention also provides a multilayer flexible planar embedded laminated electrode obtained by using the above method.

The multilayer flexible planar embedded laminated electrode provided in the present invention may be used to manufacture organic single crystal field effect transistor.

The present invention has the following advantages:

The present invention manufactures the multilayer flexible planar embedded laminated electrode, of which electrode structure is embedded electrode that the electrode and insulating layer are in the same planar and is flexible, and enables the electrode, the insulating layer and organic crystal to completely contact, thus, organic single crystals field-effect transistor of high-performance can be manufactured; manufacturing method provided by the present invention can be operated at room temperature, and the organic semiconductor does not experience the damage to the radiation, the developer and the stripping liquid; the manufacturing method manufactures the electrode by using high precise photolithography technique, and high precise and complex patterns can be manufactured, thus, high integration and convenient and practical can be achieved; because the flexibility of the PDMS and the metal itself is very well, the electrode, the insulating layer and the substrate are flexible, thus, the manufacturation of full flexible devices can be implemented; because the semiconductor and the electrode and the insulating layer are bonded together by the function of the electrostatic adsorption, the electrode can be reused; such flexible planar embedded laminated electrode is suitable to organic single crystal with various sizes.

DETAILED DESCRIPTION

Figure 5:
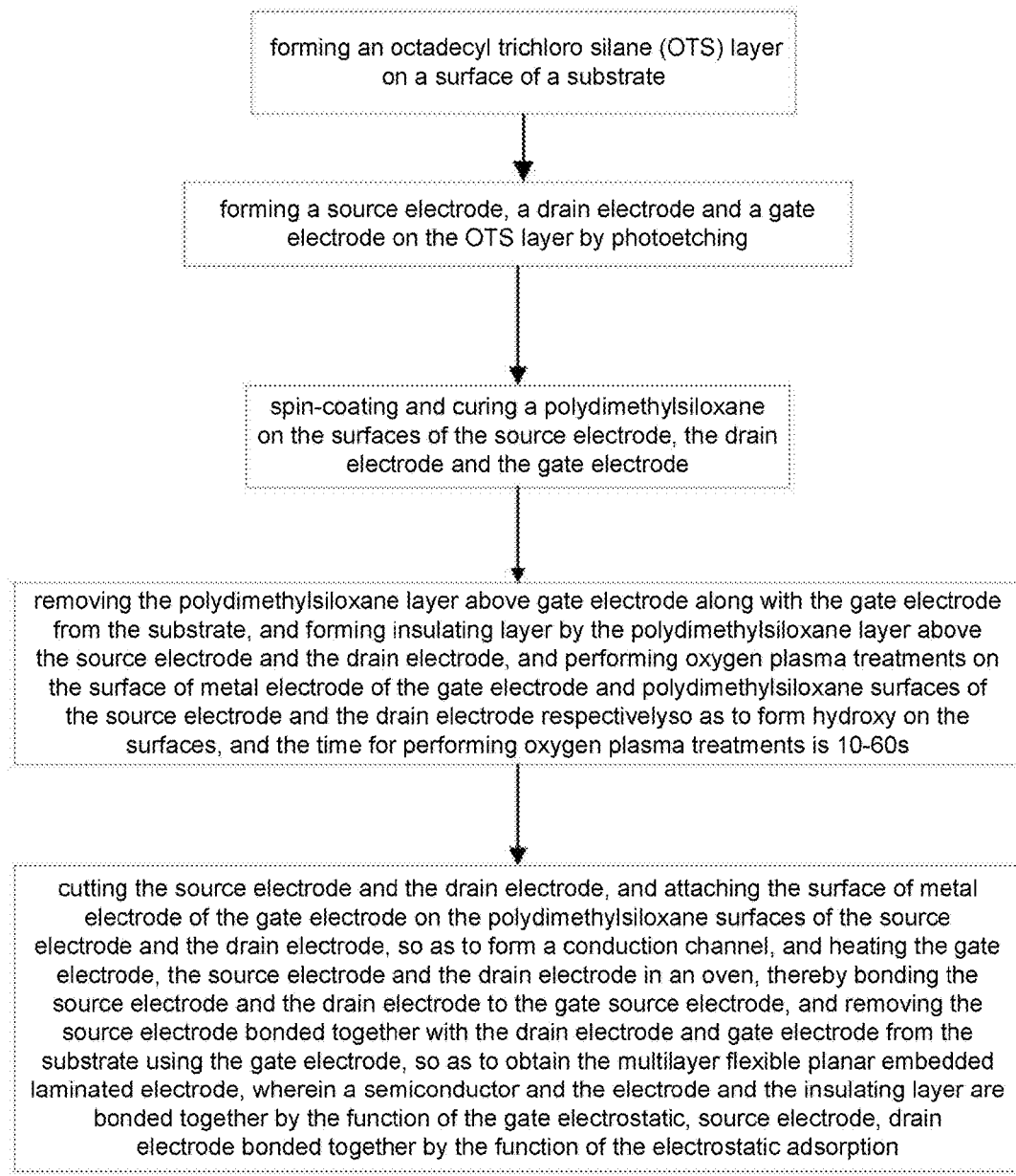
FIG. 5 is an example flow chart of a method for manufacturing the flexible planar embedded laminated electrode according to an embodiment.
Figure 6:
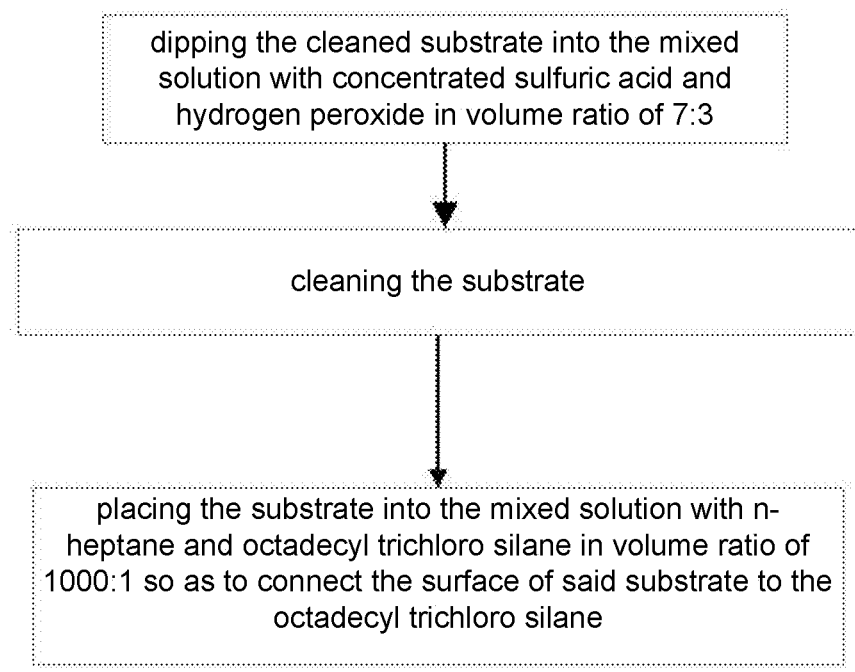
FIG. 6 is an example flow chart of a process for connecting octadecyl trichloro silane according to an embodiment.
Figure 7:
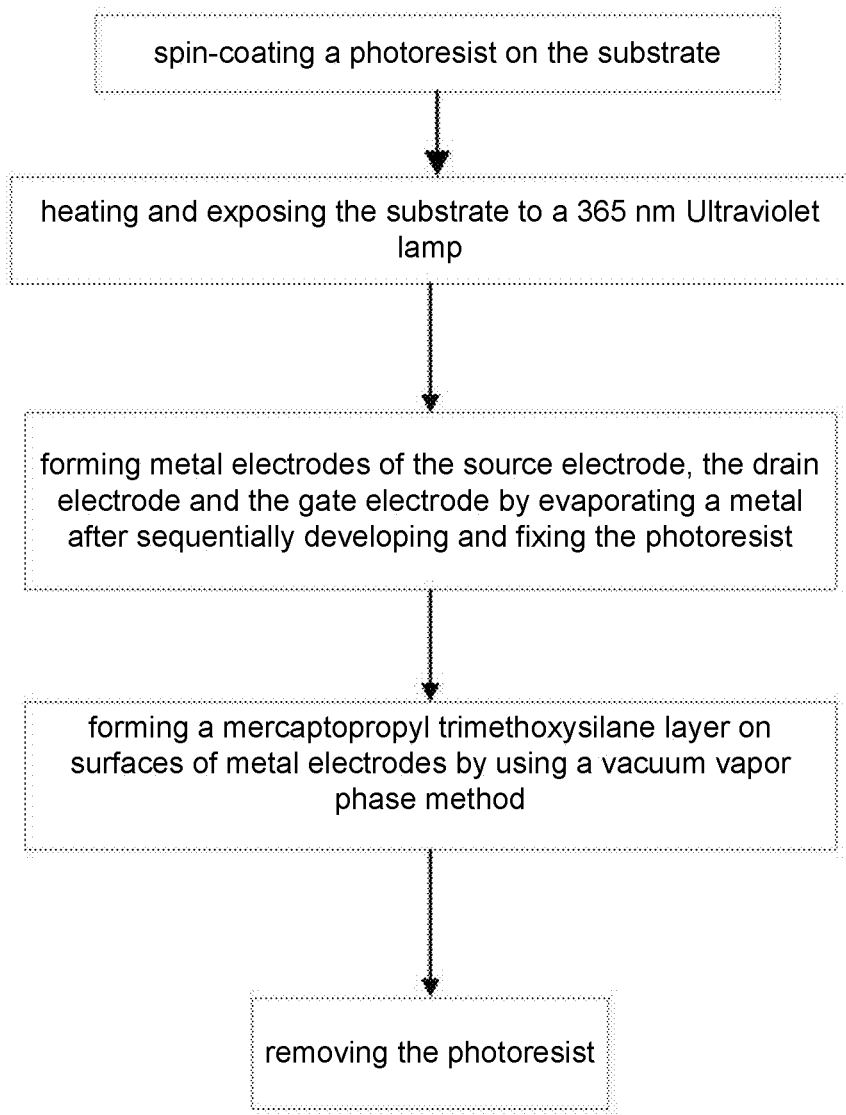
FIG. 7 is an example flow chart of a process for photoetching according to an embodiment.

The following embodiment will be described with reference to flow charts shown in FIGS. 5-7. The experimental method described below, unless otherwise specification, are the conventional methods.

Embodiment 1, Manufacturing a Flexible Planar Embedded Laminated Electrode

1. A silicon surface is modified using Octadecyl trichloro silane (OTS): firstly cleaning the surface of the substrate; then placing the substrate in piranha solution (solution of concentrated sulfuric acid and hydrogen peroxide in volume ratio of 7:3), forming hydroxylation at the surface of substrate; cleaning substrate again; placing the substrate OTS solution of n-heptane in volume ratio of 1000:1, enabling the surface of substrate to form a layer of OTS.

2. A source/drain and the gate electrodes are manufactured on the OTS modified substrates using photolithography method respectively, and mercaptopropyl trimethoxysilane (MPT) may be modified at the surface of the metal surface: firstly, photoetching (baking temperature: 100 degrees; baking time: 3 minutes (min); exposure time: 20 s; developing time: 60 s; fixing time: 30 s) on the substrate using AZ5214E photoresist; and then vacuum vapor depositing a layer of gold (degree of vacuum: $10^{-6}$ torr; rate of vapor deposition: 0.01 nm/s; thickness of deposition: 25 nm); before removing glue, a layer of MPT molecule (thickness of 1-5 nm) is modified using the vacuum vapor phase method (the specific method is that the source, drain, gate electrodes and 30 µL mercaptopropyl trimethoxysilane are placed simultaneously into the vacuum system, with keeping pressure of 7000 Pa pressure for 20 min, finally a layer of mercaptopropyl trimethoxysilane is formed at the surface of electrode), of which aim is to have a good connection between polydimethylsiloxane PDMS and metal, so as to beneficially transfer the metal electrode from the surface of substrate; after modifying MPT, and the glue is removed using N-methylpyrrolidone solution, of which aim is to only modify MPT at metal surface, the surface of substrate does not have MPT molecule.

3. A polydimethylsiloxane (PDMS) with different thicknesses is spin-coated and cured respectively on a source/drain and gate electrodes of photo-etched and modified MPT:

A PDMS solution is configured in ratio of 10:1 (PDMS: curing agent, volume ratio) and then is standing for 2 hours after stirring; a layer of PDMS solution of 200 micrometers is directly spin-coated on the gate electrode of the photo-etched and modified MPT, and then is placed into the over to heat at 70 degrees and cure for 12 hours; PDMS after standing is placed into hexane solution for diluting at 1:10 volume ratio, stirring and standing; a layer PDMS n-hexane solution of 1 µm is spin-coated on the source/drain electrodes of the photo-etched and modified MPT, which is then placed into the over for heating at 70 degrees and curing for 12 hours.

4. The surfaces of the source/drain, gate electrodes are treated using an oxygen plasma: First, the PDMS with the gate is transferred from the silicon substrate; then the transferred gate and source/drain electrodes with PDMS are simultaneously placed into oxygen plasma for treating 100 s, which enables its surface to be hydroxylated—the surface with metal electrode of gate and the PDMS layer surface of the source/drain electrodes.

5. The source/drain electrodes are clipped: source/drain electrodes with PDMS are clipped using probes (for the fine electrode), in order to facilitate future testing.

6. The gate electrode and the source/drain electrodes are aligned and heated: the gate and the source/drain electrodes are aligned in the microscope using the alignment tool (which can implement leveling for up, down, left and right); the aligned electrodes are placed in the oven (temperature: 70 degrees) for heating 10 minutes, in order to make the gate and the source/drain electrodes form irreversible bond to connect tightly with each other, thus, PDMS layer of source/drain electrodes and the metal electrode surface of gate are connected together.

Figure 1:
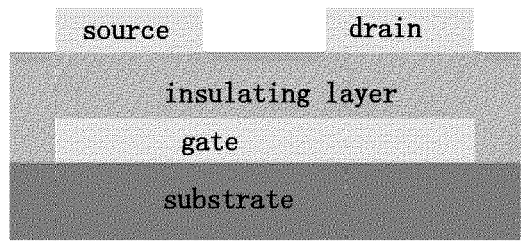
FIG. 1 is a schematic view of a conventional bottom-gate bottom-contact electrode structure.
Figure 2:
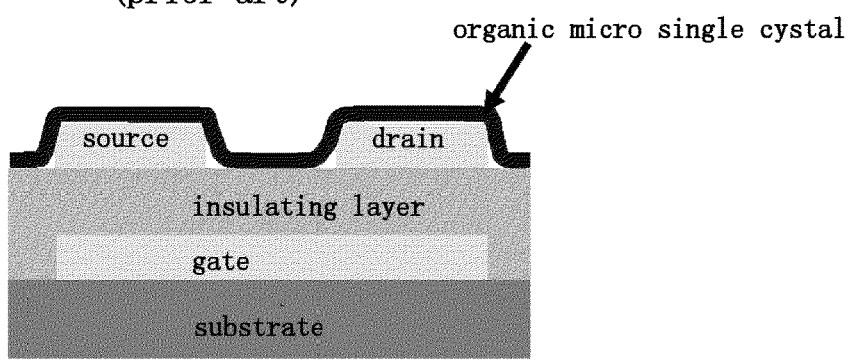
FIG. 2 is a schematic view of a conventional organic micro/nano single crystalline semiconductor and traditional bottom-gate bottom-contact electrode contact.
Figure 3:
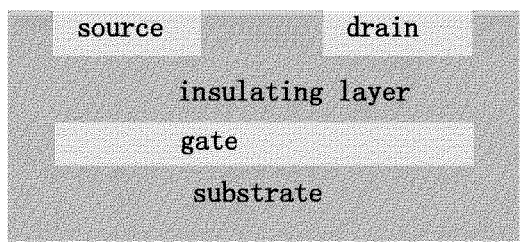
FIG. 3 is a schematic view of structure of multilayer flexible planar embedded laminated electrode manufactured by embodiment 1.

7. The source/drain electrodes with thin PDMS are wholly transferred using the gate electrode with thicker PDMS, so as to form a multilayer planar embedded laminated electrode. Because the flexibilities of PDMS and the metal per se are well, the formed electrode, insulating layer and substrate are the full flexible planar embedded laminated electrodes, as shown in FIG. 3.

Figure 4:
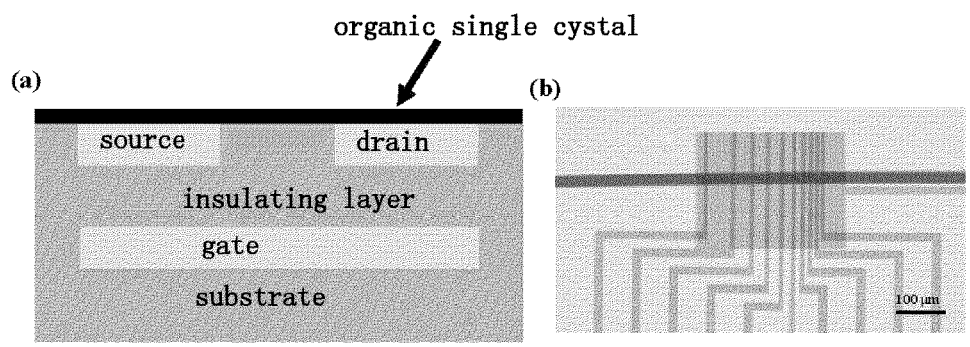
FIG. 4 is schematic view of structure (FIG. 4(a)) and microscope view (FIG. 4(b)) of multilayer flexible plane embedded laminated electrode field effect transistor manufactured by embodiment 1.

A copper phthalocyanine organic single crystal (the size of copper phthalocyanine single crystal is: length: 260 µm; width: 4.35 µm; thickness: 0.15 µm) is placed on the flexible planar embedded laminated electrode manufactured by the present embodiment, further to form the organic single crystal field effect transistor, as shown in FIG. 4, wherein FIG. 4 (a) is the structure schematic view of flexible planar embedded laminated electrode, and FIG. 4 (b) is the microscope view of flexible planar embedded laminated electrode field effect transistor.

The transfer curve of copper phthalocyanine single crystal field-effect transistor described above is shown in FIG. 8 (*a*). The output curve is shown in FIG. 8 (*b*).

Figure 8:
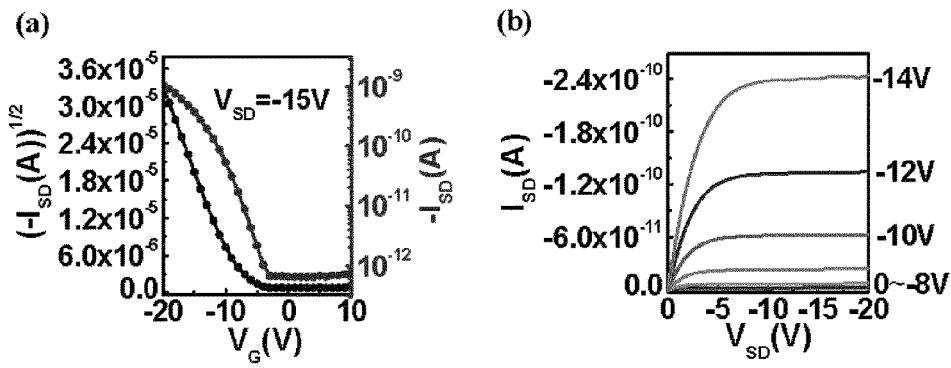
FIG. 8 is transfer curve (FIG. 8 (a)) and output curve (FIG. 8 (b)) for multilayer flexible planar embedded laminated electrode (the thickness of PDMS insulting layer:1 µm) manufactured by embodiment 1 being applied to the phthalocyanine copper single crystal field effect transistor.

It can be seen from FIG. 8, the mobility of copper phthalocyanine is 0.243 cm$^2$/Vs. The mobility of organic single crystal field effect transistor manufactured by the multilayer flexible planar embedded laminated electrode of the present invention is higher than the mobility of the copper phthalocyanine (Advanced Materials 2006, 18, 65) single crystal field effect transistor in the literature. On the one hand, the above results show that multilayer flexible planar embedded laminated electrode of the present invention can manufacture organic single crystal field effect transistors with high-performance.

Figure 9:
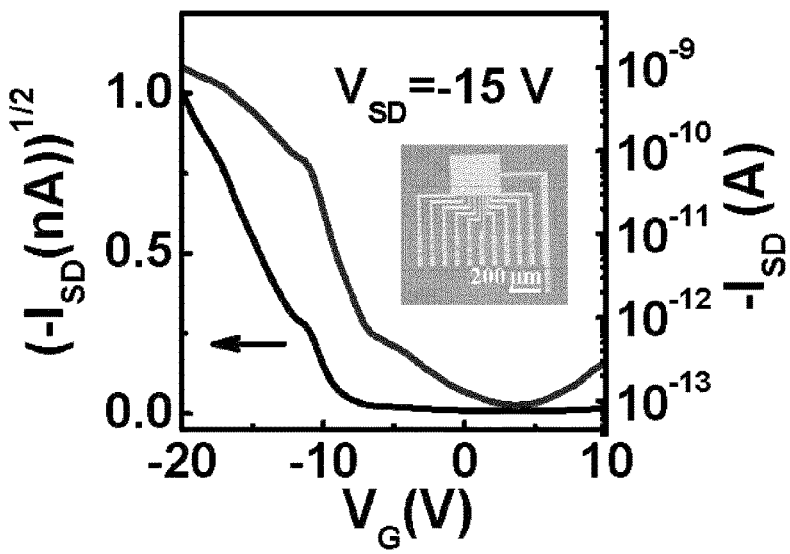
FIG. 9 is microscope view (illustration) and transfer curve view of multilayer flexible planar embedded laminated electrode manufactured by embodiment 1 being applied to the phthalocyanine copper single crystal field effect transistor, which is reusable.

For the flexible planar embedded laminated electrode manufactured by the present invention, because the electrode of semiconductor and the insulating layer are bonded together by use of electrostatic adsorption, organic single crystals can be transferred, so that the characteristic of reuse for flexible planar embedded laminated electrode manufactured by the present invention. FIG. 9 is microscope view (the illustration shaded in FIG. 9) and the curve of device transferring (FIG. 9) that the flexible planar embedded laminated electrode reuses copper phthalocyanine organic single crystal field effect transistor.

Figure 10:
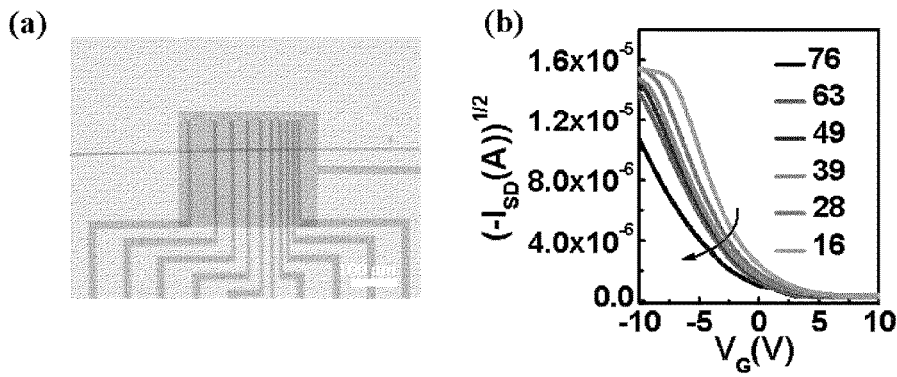
FIG. 10 is microscope view (FIG. 10(a)) and transfer curve (FIG. 10(b)) view of a plurality of variable channel devices manufactured by multilayer flexible planar embedded laminated electrode manufactured by embodiment 1.

For the multilayer flexible planar laminated electrode manufactured by the present invention, since the electrode patterning process is manufactured by a photolithography technique, the high precise, complex pattern can be formed. Thus, the manufacturation for device with high integration can be implemented by using this flexible planar laminated electrode. FIGS. 10 (*a*) and 10 (*b*) can represent respectively a microscope view and curve of device transferring for manufacturing a plurality of copper phthalocyanine organic single crystal field effect transistor with different channels using this planar laminated electrode once.

Figure 11:
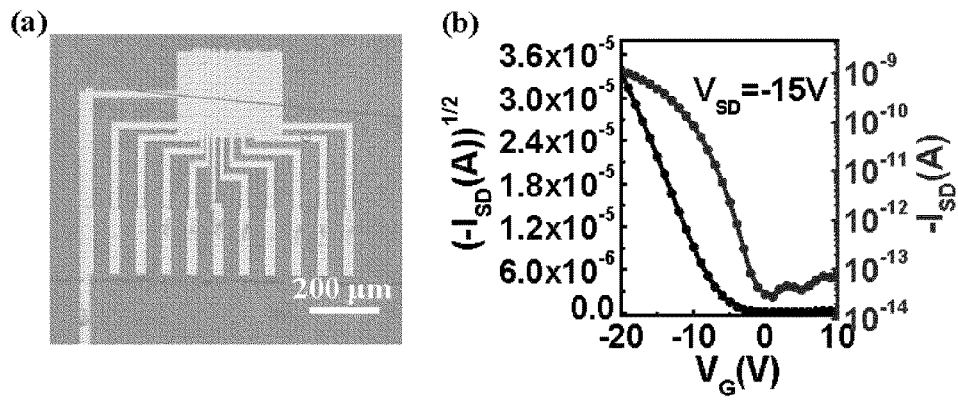
FIG. 11 is microscope view (FIG. 11 (a)) and transfer curve view (FIG. 11 (b)) for multilayer flexible planar embedded laminated electrode manufactured by embodiment 1 being applied to the phthalocyanine copper micro/nano single-crystal.

The electrode manufactured by the present invention is a flexible planar embedded electrode. Such electrode can be used to organic single crystals in various sizes. FIGS. 11 (*a*) and 11 (*b*) represent a microscope view and curve for device transferring for applying to micro/nano single crystal of copper phthalocyanine by using this planar laminated electrode respectively.

Figure 12:
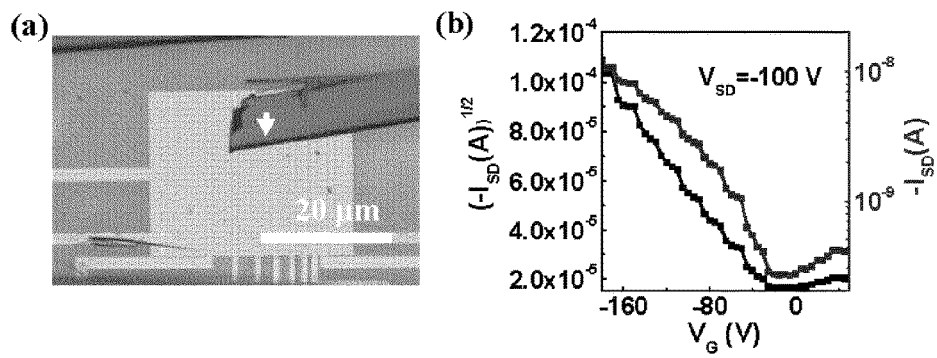
FIG. 12 is microscope view (FIG. 12 (a)) and transfer curve view (FIG. 12 (b)) of multilayer flexible planar embedded laminated electrode manufactured by embodiment 1 being applied to the phthalocyanine copper large size single-crystal (>100 microns).

The planar laminated electrode provided by using the present invention can be applied to large size single crystal (>100 microns), as shown in FIG. 12 (*a*), which the microscope view of organic single crystal field effect transistor is obtained by placing copper phthalocyanine large-sized single crystal, and transfer curve thereof is shown in FIG. 12 (*b*).

Embodiment 2, Manufacturing a Flexible Planar Embedded Laminated Electrode

1. A glass surface is modified using Octadecyl trichloro silane (OTS): firstly cleaning the surface of the substrate; then placing the substrate in piranha solution (solution of concentrated sulfuric acid and hydrogen peroxide in volume ratio of 7:3), forming hydroxylation at the surface of substrate; cleaning substrate again; placing the substrate OTS solution of n-heptane in volume ratio of 1000:1, enabling the surface of substrate to form a layer of OTS.

2. A source/drain and the gate electrodes are manufactured on the OTS modified substrates using photolithography method respectively, and mercaptopropyl trimethoxysilane (MPT) may be modified at the surface of the metal surface: firstly, photoetching (baking temperature: 100° C.; baking time: 3 minutes (min); exposure time: 20 s; developing time: 60 s; fixing time: 30 s) on the substrate using AZ5214E photoresist; and then vacuum vapor depositing a layer of gold (degree of vacuum: 10$^{-6}$ torr; rate of vapor deposition: 0.01 nm/s; thickness of deposition: 25 nm); before removing glue, a layer of MPT molecule (1-5 nm) is modified using the vacuum (degree of vacuum as 7000 Pa) vapor phase method (the specific method is that the source, drain, gate electrodes and 30 μL mercaptopropyl trimethoxysilane are placed simultaneously into the vacuum system, with keeping pressure of 7000 Pa pressure for 20 min), of which aim is to have a good connection between polydimethylsiloxane PDMS and metal, so as to beneficially transfer the metal electrode from the surface of substrate; after modifying MPT, and the glue is removed using N-methylpyrrolidone solution, of which aim is to only modify MPT at metal surface, the surface of substrate does not have MPT molecule.

3. A polydimethylsiloxane PDMS with different thicknesses is spin-coated and cured respectively on a source/drain and gate electrodes of photo-etched and modified MPT:

A PDMS solution is configured in ratio of 10:1 (PDMS:curing agent, volume ratio) and then is standing for 1 hour (h) after stirring; a layer of PDMS solution of 200 μm is directly spin-coated on the gate electrode of the photo-etched and modified MPT, and then is placed into the over to heat and cure (heating at 70° C. and curing for 12 h); PDMS after standing is placed into hexane solution for diluting 10 times, stirring and standing; a layer stirred PDMS n-hexane solution (the thickness is about 1 μm) is spin-coated on the source/drain electrodes of the photo-etched and modified MPT, which is then placed into the over for heating at 70° C. and curing for above 12 hours.

4. The surfaces of the source/drain, gate electrodes are treated using an oxygen plasma: First, the PDMS with the gate is transferred; then the transferred gate and source/drain electrodes with PDMS are simultaneously placed into oxygen plasma for treating 100 s, which enables its surface to be hydroxylated—the surface with metal electrode of gate and the PDMS layer surface of the source/drain electrodes.

5. The source/drain electrodes are clipped: source/drain electrodes with PDMS are clipped using probes or blades (for the fine electrode), in order to facilitate future testing.

6. The gate electrode and the source/drain electrodes are aligned and heated: the gate and the source/drain electrodes are aligned using the alignment tool; the aligned electrodes are placed in the oven (temperature: 70° C.) for heating 10 minutes, in order to make the gate and the source/drain electrodes form irreversible bond to connect tightly with each other, thus, PDMS layer of source/drain electrodes and the metal electrode surface of gate are connected together.

7. The source/drain electrodes with thin PDMS are wholly transferred using the gate electrode with thicker PDMS, so as to form a planar embedded laminated electrode. Because the flexibilities of PDMS and the metal per se are well, the formed electrode, insulating layer and substrate are the full flexible planar embedded laminated electrodes.

Figure 13:
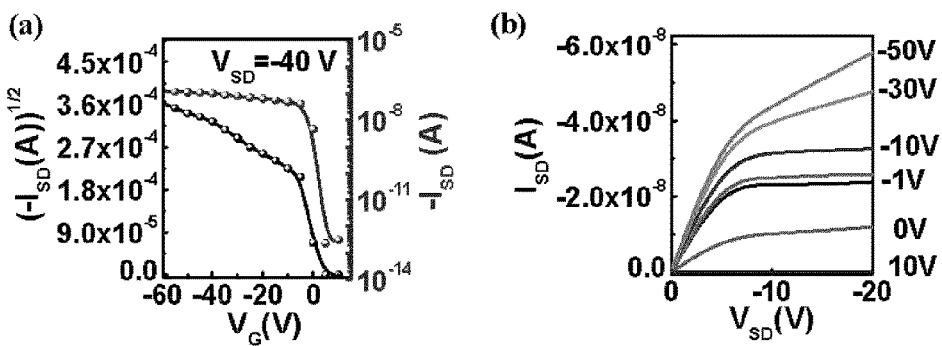
FIG. 13 is transfer curve (FIG. 13(a)) and output curve (FIG. 13(b)) of multilayer flexible planar embedded laminated electrode (the thick of PDMS insulting layer is 1 µm) manufactured by embodiment 2 being applied to the rubrene single-crystal field effect transistor.

A rubrene organic single crystal is placed on the multilayer flexible planar embedded laminated electrode, so as to form the organic single crystal field effect transistor (the size of rubrene organic single crystal is: length: 300 μm; width: 7.5 μm; thickness: 0.2 μm). The mobility of the rubrene device is 2.4 cm$^2$/Vs. FIGS. 13 (*a*) and 13 (*b*) are the transferring curve and output curve of the rubrene device respectively. The mobility of organic single crystal field effect transistor manufactured by the flexible planar embedded laminated electrode of the present invention is higher than the mobility of the rubrene (Nature Materials 2006, 444, 913) single crystal field effect transistor in the literature. On the one hand, the above results show that flexible planar embedded laminated electrode of the present invention can manufacture organic single crystal field effect transistors with high-performance, on the other hand, the above results show that multilayer flexible planar embedded laminated electrode of the present invention can be applied to various organic single crystal semiconductors, and to manufacture organic single crystal field effect transistors with higher performance.

Embodiment 3, Manufacturing a Flexible Planar Embedded Laminated Electrode

1. A glass surface is modified using Octadecyl trichloro silane (OTS): firstly cleaning the surface of the substrate; then placing the substrate in piranha solution (solution of concentrated sulfuric acid and hydrogen peroxide in volume ratio of 7:3), forming hydroxylation at the surface of substrate; cleaning substrate again; placing the substrate OTS solution of n-heptane in volume ratio of 1000:1, enabling the surface of substrate to form a layer of OTS.

2. A source/drain and the gate electrodes are manufactured on the OTS modified substrates using photolithography method respectively, and mercaptopropyl trimethoxysilane (MPT) may be modified at the surface of the metal surface: firstly, photoetching (baking temperature: 100 degrees; baking time: 3 minutes (min); exposure time: 20 s; developing time: 60 s; fixing time: 30 s) on the substrate using AZ5214E photoresist; and then vacuum vapor depositing a layer of gold (degree of vacuum: $10^{-6}$ torr; rate of vapor deposition: 0.01 nm/s; thickness of deposition: 25 nm); before removing glue, a layer of MPT molecule (1-5 nm) is modified using the vacuum (degree of vacuum as 0.01 MP) vapor phase method (the specific method is that the source, drain, gate electrodes and 30 µL mercaptopropyl trimethoxysilane are placed simultaneously into the vacuum system, with keeping pressure of 7000 Pa pressure for 20 min), of which aim is to have a good connection between polydimethylsiloxane PDMS and metal, so as to beneficially transfer the metal electrode from the surface of substrate; after modifying MPT, and the glue is removed using N-methylpyrrolidone solution, of which aim is to only modify MPT at metal surface, the surface of substrate does not have MPT molecule.

3. A polydimethylsiloxane PDMS with different thicknesses is spin-coated and cured respectively on a source/drain and gate electrodes of photo-etched and modified MPT:

A PDMS solution is configured in ratio of 10:1 (PDMS: curing agent, mass ratio) and then standing after stirring; a layer of PDMS solution of 100 micron is directly spin-coated on the gate electrode of the photo-etched and modified MPT, and then is placed into the over to heat and cure (heating at 70 degrees and curing for 12 hours); PDMS after standing is placed into hexane solution for diluting 4 times, stirring and standing; a layer stirred PDMS n-hexane solution (the thickness is about 5 microns) is spin-coated on the source/drain electrodes of the photo-etched and modified MPT, which is then placed into the over for heating at 70 degrees and curing for 12 hours.

4. The surfaces of the source/drain, gate electrodes are treated using an oxygen plasma: First, the PDMS with the gate is transferred; then the transferred gate and source/drain electrodes with PDMS are simultaneously placed into oxygen plasma for treating 100 s, which enables its surface to be hydroxylated—the surface with metal electrode of gate and the PDMS layer surface of the source/drain electrodes.

5. The source/drain electrodes are clipped: source/drain electrodes with PDMS are clipped using probes (for the fine electrode), in order to facilitate future testing.

6. The gate electrode and the source/drain electrodes are aligned and heated: the gate and the source/drain electrodes are aligned using the alignment tool; the aligned electrodes are placed in the oven (temperature: 70 degrees; time: 20 minutes) for heating 10 minutes, in order to make the gate and the source/drain electrodes form irreversible bond to connect tightly with each other, thus, PDMS layer of source/drain electrodes and the metal electrode surface of gate are connected together.

7. The source/drain electrodes with thin PDMS are wholly transferred using the gate electrode with thicker PDMS, so as to form a planar embedded laminated electrode. Because the flexibilities of PDMS and the metal per se are well, the formed electrode, insulating layer and substrate are the full flexible planar embedded laminated electrodes.

Figure 14:
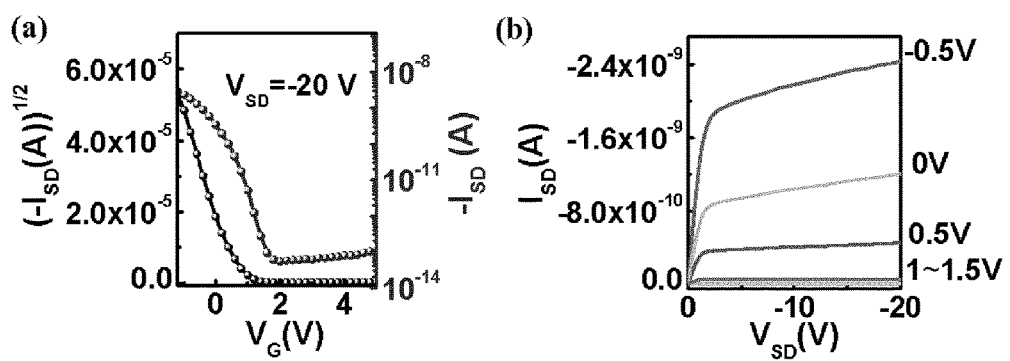
FIG. 14 is transfer curve (FIG. 14(a)) and output curve (FIG. 14(b)) of multilayer flexible planar embedded laminated electrode (the thick of PDMS insulting layer is 5 µm) manufactured by embodiment 3 being applied to the rubrene single-crystal field effect transistor.

A rubrene organic single crystal is placed on the multilayer flexible planar embedded laminated electrode, so as to form the organic single crystal field effect transistor (the size of rubrene organic single crystal is: length: 410 µm; width: 9.9 µm; thickness: 0.4 µm). The highest mobility of the rubrene device is 25.23 $cm^2/Vs$. FIGS. 14 (a) and 14 (b) are the transferring curve and output curve of the rubrene device respectively. The mobility of organic single crystal field effect transistor manufactured by the flexible planar embedded laminated electrode of the present invention is highest value than the mobility of the rubrene (Physical Review Letters 2004, 93, 086602) single crystal in the literature. On the one hand, the above results show that flexible planar embedded laminated electrode of the present invention can manufacture organic single crystal field effect transistors with high-performance.

INDUSTRIAL APPLICATION

The multilayer flexible planar embedded laminated electrode manufactured by the manufacturing method of the present invention, of which electrode structure is embedded electrode that the electrode and insulating layer are in the same planar and is flexible, and enables the electrode, the insulating layer and organic crystal to completely contact, thus, organic single crystals field effect transistor of high-performance can be manufactured; the manufacturing method provided by the present invention can be operated at room temperature, and the organic semiconductor does not experience the damage to the radiation, the developer and the stripping liquid; the electrodes are manufactured using high precise photolithography technique, and high precise and complex patterns can be manufactured, thus, high integration and convenient and practical can be achieved; because the flexibility of the PDMS and the metal itself is very good, the electrode, the insulating layer and the substrate are flexible, thus, the manufacturation of full flexible devices can be implemented; because the semiconductor and the electrode and the insulating layer are bound together by the function of the electrostatic adsorption, the electrode can be reused; such flexible planar embedded laminated electrode is suitable to organic single crystal for various sizes.

What is claimed is:

1. A method for manufacturing a flexible planar embedded laminated electrode, comprising:

(1) forming an octadecyl trichloro silane (OTS) layer on a surface of a substrate;
(2) forming a source electrode, a drain electrode and a gate electrode on the OTS layer by photoetching, wherein the photoetching comprises:
   spin-coating a photoresist on the substrate;
   heating and exposing the substrate to 365 nm Ultraviolet light nm;
   forming the source electrode, the drain electrode and the gate electrode as metal electrodes by evaporating a metal after sequentially developing and fixing the photoresist; and
   forming a mercaptopropyl trimethoxysilane layer on surfaces of the metal electrodes by a vacuum vapor phase method; and
   removing the photoresist;
(3) spin-coating and curing a polydimethylsiloxane on the surfaces of the source electrode, the drain electrode and the gate electrode, wherein the surface of the gate electrode is spin-coated using thicker polydimethylsiloxane, and the surfaces of the source and drain electrodes are spin-coated using thinner polydimethylsiloxane;
(4) removing the polydimethylsiloxane layer above the gate electrode along with the gate electrode from the substrate, and forming an insulating layer by the polydimethylsiloxane layer above the source electrode and the drain electrode; and
   performing oxygen plasma treatments on the surface of the gate electrode and polydimethylsiloxane surfaces of the source electrode and the drain electrode respectively so as to form hydroxy on the surfaces, wherein oxygen plasma treatments are performed for 10-60 seconds;
(5) cutting the source electrode and the drain electrode; and
   attaching the surface of metal electrode of the gate electrode on the polydimethylsiloxane surfaces of the source electrode and the drain electrode, so as to form a conduction channel; and
   heating the gate electrode, the source electrode and the drain electrode in an oven, thereby bonding the source electrode and the drain electrode to the gate electrode, and
   entirely removing the source and drain electrodes with thinner polydimethylsiloxane using the gate electrode with thicker polydimethylsiloxane, so as to obtain the multilayer flexible planar embedded laminated electrode, wherein a semiconductor is bonded together with the source, drain and gate electrodes and the insulating layer by electrostatic adsorption.

2. The manufacturing method of claim 1, wherein in step (1), the step for forming the OTS layer comprises:
   dipping the cleaned substrate into the mixed solution with concentrated sulfuric acid and hydrogen peroxide in volume ratio of 7:3; and
   cleaning the substrate; and
   placing the substrate into the mixed solution with n-heptane and octadecyl trichloro silane in volume ratio of 1000:1 so as to connect the surface of said substrate to the octadecyl trichloro silane.

3. The manufacturing method of claim 1, wherein in step (3), the thickness of the polydimethylsiloxane spin-coated on the gate electrode is 50-500 μm;
   the thicknesses of polydimethylsiloxane spin-coated on the source electrode and the drain electrode are each 0.8-5 μm; and
   the curing temperature is 70-100° C., the curing time may be 2-12 hours.

4. The manufacturing method of claim 1, wherein in step (5), the heating temperature is 70-100° C., the heating time is 10-30 minutes.

5. The multilayer flexible planar embedded laminated electrode manufactured by method of claim 1.

6. The application for the multilayer flexible planar embedded laminated electrode of claim 5 in manufacturing organic single crystal field effect transistor.

* * * * *